United States Patent
Lin et al.

(10) Patent No.: US 11,404,333 B2
(45) Date of Patent: Aug. 2, 2022

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Yuan-Ting Lin, Kaohsiung (TW); Che Wei Chang, Kaohsiung (TW); Chi-Yu Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 158 days.

(21) Appl. No.: 16/262,771

(22) Filed: Jan. 30, 2019

(65) Prior Publication Data

US 2020/0243406 A1   Jul. 30, 2020

(51) Int. Cl.
*H01L 27/00* (2006.01)
*H01L 21/66* (2006.01)
*H01L 23/00* (2006.01)

(52) U.S. Cl.
CPC .............. *H01L 22/34* (2013.01); *H01L 22/14* (2013.01); *H01L 24/13* (2013.01); *H01L 24/24* (2013.01); *H01L 24/25* (2013.01); *H01L 24/73* (2013.01); *H01L 24/82* (2013.01); *H01L 2224/13024* (2013.01); *H01L 2224/24101* (2013.01); *H01L 2224/24137* (2013.01); *H01L 2224/25171* (2013.01); *H01L 2224/25175* (2013.01); *H01L 2224/73209* (2013.01); *H01L 2224/82007* (2013.01); *H01L 2224/829* (2013.01); *H01L 2224/82106* (2013.01)

(58) Field of Classification Search
None
See application file for complete search history.

(56) References Cited

U.S. PATENT DOCUMENTS

| | | | |
|---|---|---|---|
| 9,484,307 B2 | 11/2016 | Tsai et al. | |
| 9,773,753 B1 | 9/2017 | Lin et al. | |
| 2016/0218063 A1* | 7/2016 | Tsai | H01L 23/3135 |

* cited by examiner

*Primary Examiner* — Reema Patel
(74) *Attorney, Agent, or Firm* — Foley & Lardner LLP

(57) ABSTRACT

A semiconductor device includes a first semiconductor die, a second semiconductor die, a dielectric layer, a first redistribution layer and a second redistribution layer. The first semiconductor die includes a first bonding pad and a second bonding pad. The second semiconductor die includes a third bonding pad and a fourth bonding pad. The dielectric layer covers the first semiconductor die and the second semiconductor die, and defines a first opening exposing the first bonding pad and the second bonding pad and a second opening exposing the third bonding pad and the fourth bonding pad. The first redistribution layer is disposed on the dielectric layer, and electrically connects the first bonding pad and the third bonding pad. The second redistribution layer is disposed on the dielectric layer, and electrically connects the second bonding pad and the fourth bonding pad.

19 Claims, 11 Drawing Sheets

SEMICONDUCTOR DEVICE AND METHOD FOR MANUFACTURING THE SAME

BACKGROUND

1. Field of the Disclosure

The present disclosure relates to a semiconductor device, and a manufacturing method, and to a semiconductor device including a dielectric layer defining an opening to expose a plurality of bonding pads, and a method for manufacturing the same.

2. Description of the Related Art

A fan-out wafer level packaging structure contains multiple semiconductor dice, an encapsulant surrounding the semiconductor dice, and at least one redistribution layer electrically connecting the semiconductor dice, where the redistribution layer is arranged on a dielectric layer on the semiconductor dice and the encapsulant. The dielectric layer may define an opening to expose at least one bonding pad of the die, and the redistribution layer may extend into the opening to contact the bonding pad. However, a short circuit between the redistribution layers on the sidewall of the opening of the dielectric layer cannot be readily detected directly.

SUMMARY

In some embodiments, a semiconductor device includes a first semiconductor die, a second semiconductor die, a dielectric layer, a first redistribution layer and a second redistribution layer. The first semiconductor die includes a first bonding pad and a second bonding pad. The second semiconductor die includes a third bonding pad and a fourth bonding pad. The dielectric layer covers the first semiconductor die and the second semiconductor die, and defines a first opening exposing the first bonding pad and the second bonding pad and a second opening exposing the third bonding pad and the fourth bonding pad. The first redistribution layer is disposed on the dielectric layer, and electrically connects the first bonding pad and the third bonding pad. The second redistribution layer is disposed on the dielectric layer, and electrically connects the second bonding pad and the fourth bonding pad.

In some embodiments, a semiconductor device includes a semiconductor die and a dielectric layer. The semiconductor die has a surface, and includes a first bonding pad, a second bonding pad and a first passivation layer. The first bonding pad is disposed adjacent to the surface of the semiconductor die. The second bonding pad is disposed adjacent to the surface of the semiconductor die. The first passivation layer is disposed adjacent to the surface of the semiconductor die. The first passivation layer surrounds and exposes the first bonding pad and the second bonding pad. The dielectric layer covers the semiconductor die, and defines a first opening exposing the first bonding pad and the second bonding pad and a measurement opening in a non-bonding pad region.

In some embodiments, a method for manufacturing a semiconductor device includes: (a) providing a first semiconductor die including a first bonding pad and a second bonding pad; (b) disposing a second semiconductor die adjacent to the first semiconductor die, wherein the second semiconductor die includes a third bonding pad and a fourth bonding pad; (c) forming a dielectric layer to cover the first semiconductor die and the second semiconductor die; and (d) forming a first opening, a second opening and a measurement opening in the dielectric layer, wherein the first opening exposes the first bonding pad and the second bonding pad, the second opening exposes the third bonding pad and the fourth bonding pad, and the measurement opening is in a non-bonding pad region.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
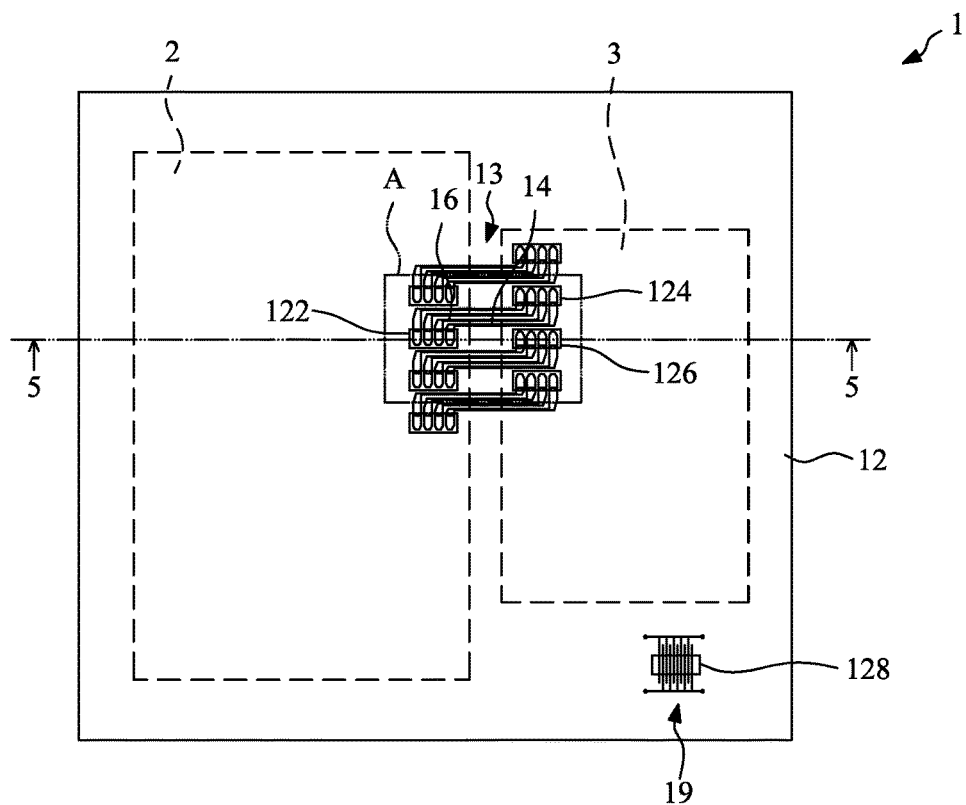
FIG. 1 illustrates a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A fan-out wafer level packaging structure may contain multiple semiconductor dice, an encapsulant surrounding the semiconductor dice and at least one redistribution layer electrically connecting the semiconductor dice. Each of the semiconductor dice may include a plurality of bonding pads and a passivation layer. The passivation layer may define a plurality of openings corresponding to respective ones of the bonding pads to expose the respective ones of the bonding pads. In a comparative embodiment, the fan-out wafer level packaging structure may further contain a dielectric layer covering the passivation layers of the semiconductor dice and the encapsulant. The redistribution layer may be arranged on the dielectric layer. The dielectric layer may define a plurality of openings to expose at least one bonding pad of each of the semiconductor dice, and the redistribution layer may extend into the opening of the dielectric layer to contact the bonding pad. In one example, the width of the opening of the dielectric layer may be less than the width of the opening of the passivation layer, and the opening of the dielectric layer may be disposed within the opening of the passivation layer. Thus, some portions of the dielectric layer may extend into the opening of the passivation layer. However, in another example, the width of the opening of the passivation layer may be reduced to a relatively small value (such as less than 30 μm), whereas the opening of the dielectric layer cannot be readily reduced to such small value. Thus, the width of the opening of the dielectric layer may be greater than the width of the opening of the passivation layer, and the dielectric layer may not extend into the opening of the passivation layer.

However, the density of the bonding pads is increased; thus, the pitch between the bonding pads (e.g., the pitch between the openings of the passivation layer) is reduced. It may be difficult for the redistribution layer to stand securely on the space between two bonding pads (e.g., between two openings of the passivation layer). In addition, the redistribution layer may be formed as follows. An entire metal layer may be formed on the top surface of the redistribution layer and in the opening of the redistribution layer. Then, portions of the metal layer may be etched away so as to form a patterned circuit layer including a plurality of redistribution layers. However, during the etching process, the portions of the metal layer to be etched may not be removed completely. That is, some portions of the metal layer to be etched may remain. As a result, the residual metal may cause a short circuit between the redistribution layers on the top surface of the dielectric layer and on the sidewall of the opening of the dielectric layer, thus causing a failure of the fan-out wafer level packaging structure. However, such short circuit cannot be readily detected directly by conducting probes of a testing apparatus to the redistribution layers since the redistribution layers may be damaged after the probes contact them.

At least some embodiments of the present disclosure provide for a semiconductor device which includes a dielectric layer defining a plurality of openings to expose a plurality of bonding pads of the semiconductor dice. In some embodiments, the dielectric layer may further define a measurement opening in a non-bonding pad region for a measurement circuit to be disposed. A current leakage measurement can be conducted to the measurement circuit so as to simulate the condition of the redistribution layers. At least some embodiments of the present disclosure further provide for techniques for manufacturing the semiconductor device.

Figure 2:
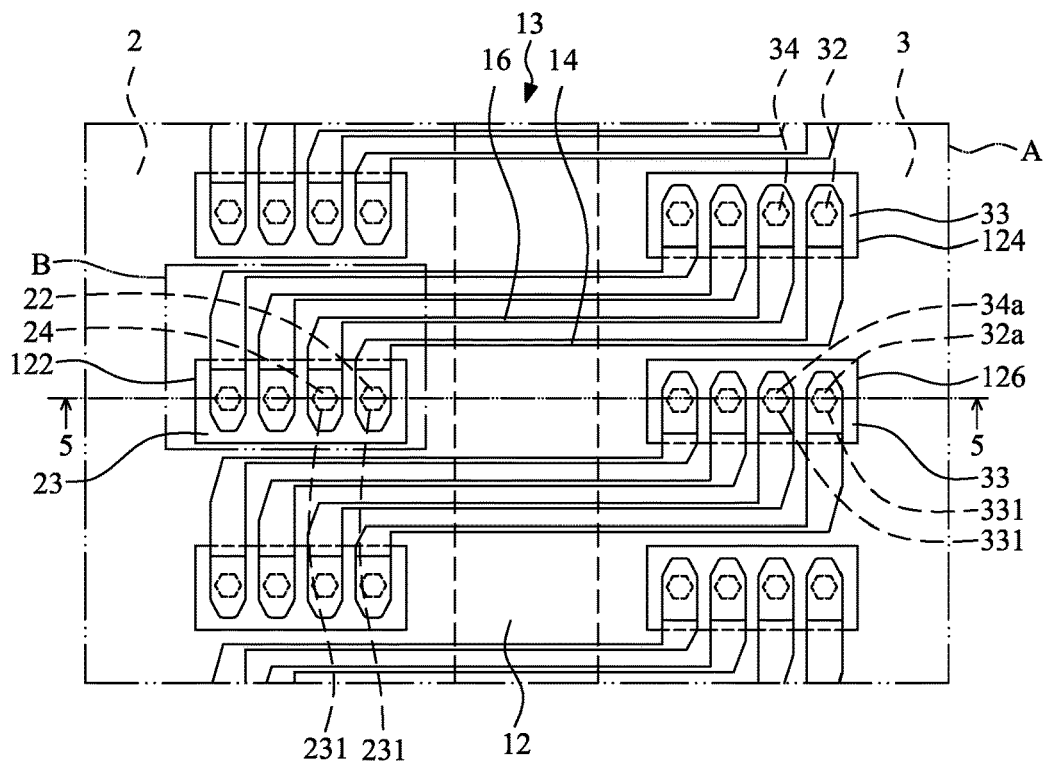
FIG. 2 illustrates an enlarged view of an area "A" shown in FIG. 1.
Figure 3:
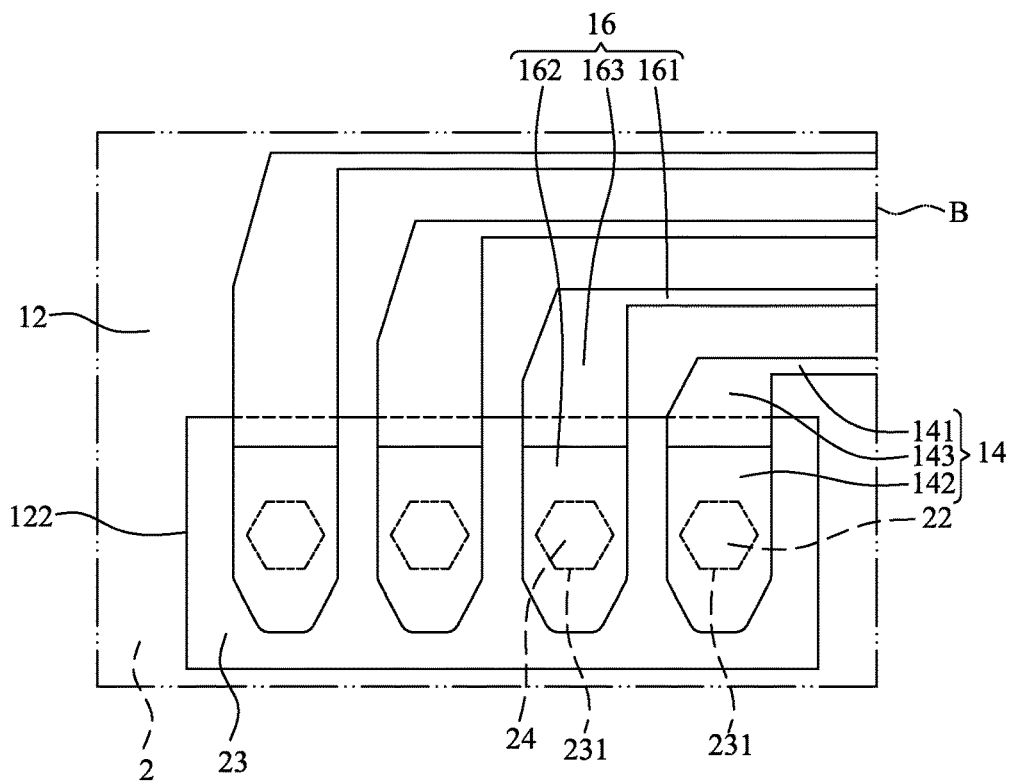
FIG. 3 illustrates an enlarged view of an area "B" shown in FIG. 2.
Figure 4:
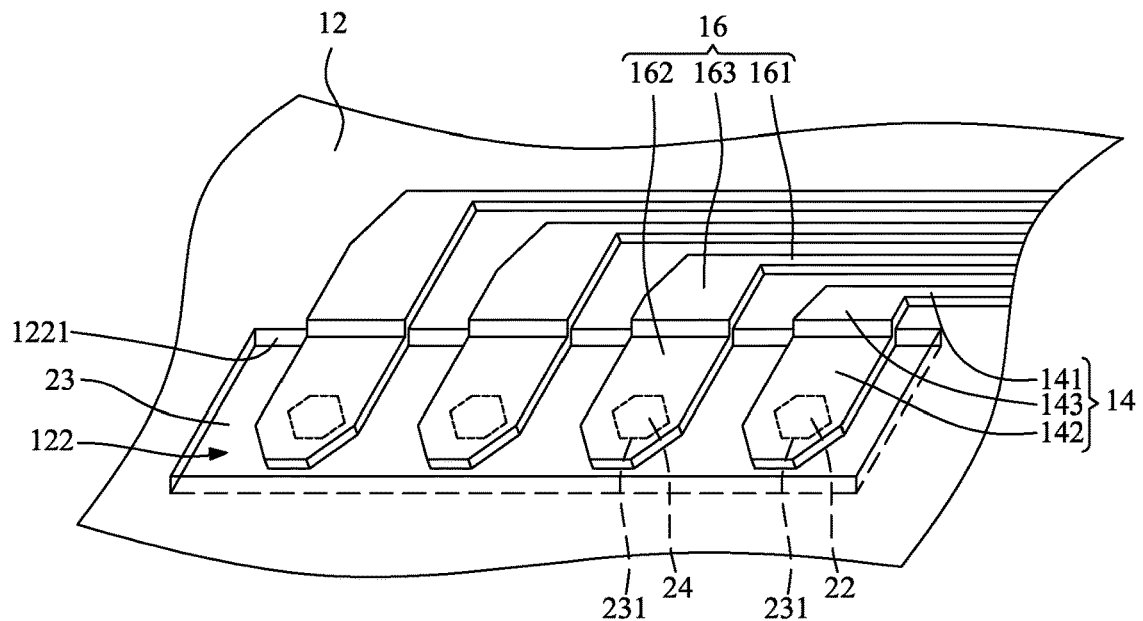
FIG. 4 illustrates a perspective view of FIG. 3.
Figure 5:
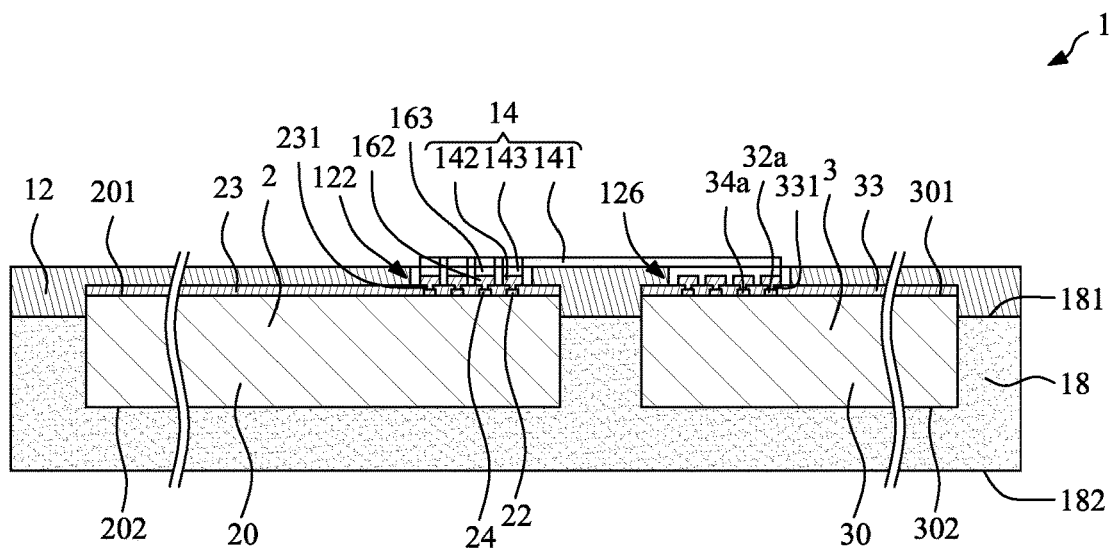
FIG. 5 illustrates a cross-sectional view taken along line 5-5 of the semiconductor device shown in FIG. 1.

FIG. 1 illustrates a top view of a semiconductor device 1 according to some embodiments of the present disclosure. FIG. 2 illustrates an enlarged view of an area "A" shown in FIG. 1. FIG. 3 illustrates an enlarged view of an area "B" shown in FIG. 2. FIG. 4 illustrates a perspective view of FIG. 3. FIG. 5 illustrates a cross-sectional view taken along line 5-5 of the semiconductor device 1 shown in FIG. 1. The semiconductor device 1 includes a first semiconductor die 2, a second semiconductor die 3, a first dielectric layer 12, a patterned circuit layer 13 and an encapsulant 18.

As shown in FIG. 1 and FIG. 5, the first semiconductor die 2 includes a first main body 20, a plurality of bonding pads (including, for example, a first bonding pad 22 and a second bonding pad 24) and a first passivation layer 23. The material of the first main body 20 may include silicon. The first main body 20 has a top surface 201 and a bottom surface 202 opposite to the top surface 201. The top surface 201 of the first main body 20 may be an active surface, and the bottom surface 202 of the first main body 20 may be a backside surface. The material of the bonding pads (including, for example, the first bonding pad 22 and the second bonding pad 24) may be conductive metal such as gold, aluminum or copper. The bonding pads (including, for example, the first bonding pad 22 and the second bonding pad 24) are disposed adjacent to the top surface 201 of the first main body 20. The material of the first passivation layer 23 may include silicon nitride or silicon oxide. The first passivation layer 23 is formed or disposed adjacent to the top surface 201 of the first main body 20 to cover portions of the bonding pads (including, for example, the first bonding pad 22 and the second bonding pad 24). The first passivation layer 23 defines a plurality of openings 231 to expose respective ones of the bonding pads (including, for example, the first bonding pad 22 and the second bonding pad 24). That is, the first passivation layer 23 surrounds and exposes the bonding pads (including, for example, the first bonding pad 22 and the second bonding pad 24).

A size of the second semiconductor die 3 may be the same as or different from a size of the first semiconductor die 2. The second semiconductor die 3 includes a second main body 30, a plurality of bonding pads (including, for example, a third bonding pad 32 and a fourth bonding pad 34) and a second passivation layer 33. The material of the second main body 30 may include silicon. The second main body 30 has a top surface 301 and a bottom surface 302 opposite to the top surface 301. The top surface 301 of the second main body 30 may be an active surface, and the bottom surface 302 of the second main body 30 may be a backside surface. The material of the bonding pads (including, for example, the third bonding pad 32 and the fourth bonding pad 34) may be conductive metal such as gold, aluminum or copper. The bonding pads (including, for example, the third bonding pad 32 and the fourth bonding pad 34) are disposed adjacent to the top surface 301 of the second main body 30. The material of the second passivation layer 33 may include silicon nitride or silicon oxide. The second passivation layer 33 is formed or disposed adjacent to the top surface 301 of the second main body 30 to cover portions of the bonding pads (including, for example, the third bonding pad 32 and the fourth bonding pad 34). The second passivation layer 33 defines a plurality of openings 331 to expose respective ones of the bonding pads (including, for example, the third bonding pad 32 and the fourth bonding pad 34). That is, the second passivation layer 33 surrounds and exposes the bonding pads (including, for example, the third bonding pad 32 and the fourth bonding pad 34). In one embodiment, the top surface of the second passivation layer 33 of the second semiconductor die 3 may be substantially coplanar with the top surface of the first passivation layer 23 of the first semiconductor die 2.

The encapsulant 18 (e.g., molding compound) covers at least a portion of the first semiconductor die 2, at least a portion of the second semiconductor die 3 and at least a portion of the first dielectric layer 12. The encapsulant 18 has a top surface 181 and a bottom surface 182 opposite to the top surface 181. As shown in FIG. 5, the top surface 181 of the encapsulant 18 is not coplanar with the top surface of the first passivation layer 23 of the first semiconductor die 2 and the top surface of the second passivation layer 33 of the second semiconductor die 3. The top surface 181 of the encapsulant 18 is lower than the top surface of the first passivation layer 23 of the first semiconductor die 2 and the top surface of the second passivation layer 33 of the second semiconductor die 3. The bottom surface 182 of the encapsulant 18 is lower than the bottom surface 202 of the first main body 20 of the first semiconductor die 2 and the bottom surface 302 of the second main body 30 of the second semiconductor die 3. Thus, the encapsulant 18 covers a bottom portion of the first semiconductor die 2 and a bottom portion of the second semiconductor die 3.

The first dielectric layer 12 is formed or disposed on the first passivation layer 23 of the first semiconductor die 2, the second passivation layer 33 of the second semiconductor die 3 and the encapsulant 18, so as to cover and contact the first passivation layer 23 of the first semiconductor die 2, the second passivation layer 33 of the second semiconductor die 3 and the encapsulant 18. The material of the first dielectric layer 12 may include cured photoimageable dielectric (PID) materials, such as an epoxy or a PI including photoinitiators, or other resin materials. The first dielectric layer 12 may define a plurality of openings (including, for example, a first opening 122, a second opening 124, a third opening 126 and a measurement opening 128). As shown in FIG. 2, FIG. 3 and FIG. 5, the first opening 122 exposes a plurality of the bonding pads (including, for example, the first bonding pad 22 and the second bonding pad 24) of the first semiconductor die 2, a plurality of the openings 231 of the first passivation layer 23, and a portion of the first passivation layer 23. That is, a plurality of the bonding pads (including, for example, the first bonding pad 22 and the second bonding pad 24) of the first semiconductor die 2, a plurality of the openings 231 of the first passivation layer 23, and a portion of the first passivation layer 23 are disposed in the first opening 122 of the first dielectric layer 12. A size (e.g., width) of the first opening 122 of the first dielectric layer 12 is greater than a size of the opening 231 of the first passivation layer 23. The first dielectric layer 12 does not extend into the opening 231 of the first passivation layer 23 to contact the bonding pads (including, for example, the first bonding pad 22 and the second bonding pad 24) of the first semiconductor die 2.

As shown in FIG. 2, the second opening 124 exposes a plurality of the bonding pads (including, for example, the third bonding pad 32 and the fourth bonding pad 34) of the second semiconductor die 3, a plurality of the openings 331 of the second passivation layer 33, and a portion of the second passivation layer 33. That is, a plurality of the bonding pads (including, for example, the third bonding pad 32 and the fourth bonding pad 34) of the second semiconductor die 3, a plurality of the openings 331 of the second passivation layer 33, and a portion of the second passivation layer 33 are disposed in the second opening 124 of the first dielectric layer 12. A size (e.g., width) of the second opening 124 of the first dielectric layer 12 is greater than a size of the opening 331 of the second passivation layer 33. The first dielectric layer 12 does not extend into the opening 331 of the second passivation layer 33 to contact the bonding pads (including, for example, the third bonding pad 32 and the fourth bonding pad 34) of the second semiconductor die 3. In one embodiment, a size (e.g., width and depth) of the second opening 124 may be substantially equal to a size of the first opening 122.

As shown in FIG. 2, the third opening 126 is disposed adjacent to the first opening 122 and the second opening 124. As shown in FIG. 2 and FIG. 5, the third opening 126 exposes a plurality of the bonding pads (including, for example, the third bonding pad 32a and the fourth bonding pad 34a) of the second semiconductor die 3, a plurality of the openings 331 of the second passivation layer 33, and a portion of the second passivation layer 33. That is, a plurality of the bonding pads (including, for example, the third bonding pad 32a and the fourth bonding pad 34a) of the second semiconductor die 3, a plurality of the openings 331 of the second passivation layer 33, and a portion of the second passivation layer 33 are disposed in the third opening 126 of the first dielectric layer 12. A size (e.g., width) of the third opening 126 of the first dielectric layer 12 is greater than a size of the opening 331 of the second passivation layer 33. The first dielectric layer 12 does not extend into the opening 331 of the second passivation layer 33 to contact the bonding pads (including, for example, the third bonding pad 32a and the fourth bonding pad 34a) of the second semiconductor die 3. In one embodiment, a size (e.g., width and depth) of the third opening 126 may be substantially equal to a size of the second opening 124.

As shown in FIG. 1, the first opening 122, the second opening 124 and the third opening 126 are disposed in a bonding pad region. That is, there are bonding pads disposed within or disposed corresponding to the first opening 122, the second opening 124 and the third opening 126. In comparison, the measurement opening 128 is disposed in a non-bonding pad region. That is, there is no bonding pad disposed within or disposed corresponding to the measurement opening 128. In one embodiment, the measurement opening 128 is disposed at a position corresponding to an outside of the first semiconductor die 2 and the second semiconductor die 3. Thus, the measurement opening 128 may expose a portion of the first dielectric layer 12 or a portion of the encapsulant 18. In one embodiment, a size (e.g., width and depth) of the measurement opening 128 may be substantially equal to a size of the first opening 122.

As shown in FIG. 1 and FIG. 5, the patterned circuit layer 13 is disposed on the first dielectric layer 12. A material of the patterned circuit layer 13 may be copper. The patterned circuit layer 13 includes a plurality of redistribution layers (including, for example, a first redistribution layer 14 and a second redistribution layer 16) and a measurement circuit 19. In one embodiment, the redistribution layers (including, for example, a first redistribution layer 14 and a second redistribution layer 16) and the measurement circuit 19 may be at the same layer and formed concurrently. The first redistribution layer 14 is disposed on the first dielectric layer 12, and electrically connects the first bonding pad 22 in the first opening 122 and the third bonding pad 32 in the second opening 124. The first redistribution layer 14 may include a trace portion and a pad portion. As shown in FIG. 1, one end of the first redistribution layer 14 extends downward into the first opening 122 to cover and contact the first bonding pad 22, and the other end of the first redistribution layer 14 extends upward into the second opening 124 to cover and contact the third bonding pad 32. Thus, the extending directions of two ends of the first redistribution layer 14 are different from each other. Similarly, the second redistribution layer 16 is disposed on the first dielectric layer 12, and electrically connects the second bonding pad 24 in the first opening 122 and the fourth bonding pad 34 in the second opening 124. The second redistribution layer 16 may include a trace portion and a pad portion. As shown in FIG. 1, one end of the second redistribution layer 16 extends downward into the first opening 122 to cover and contact the second bonding pad 24, and the other end of the second redistribution layer 16 extends upward into the second opening 124 to cover and contact the fourth bonding pad 34. Thus, the extending directions of two ends of the second redistribution layer 16 are different from each other. In one embodiment, the second redistribution layer 16 is substantially parallel with the first redistribution layer 14, and a length of the second redistribution layer 16 is substantially equal to a length of the first redistribution layer 14. In addition, the measurement circuit 19 is disposed on the first dielectric layer 12 and extends into the measurement opening 128.

As shown in FIG. 3 and FIG. 4, the first redistribution layer 14 includes a first portion 141, a second portion 142 and a third portion 143. The first portion 141 is disposed on the first dielectric layer 12. The second portion 142 is disposed in the first opening 122 and contacts the first bonding pad 22 and the first passivation layer 23. The third portion 143 connects the first portion 141 and the second portion 142. The third portion 143 is disposed on and contacts a top surface of the first dielectric layer 12 and a sidewall 1221 of the first opening 122. The first portion 141 may be defined as a trace portion. The second portion 142 and the third portion 143 may be defined as a pad portion. Similarly, the second redistribution layer 16 includes a first portion 161, a second portion 162 and a third portion 163. The first portion 161 is disposed on the first dielectric layer 12. The second portion 162 is disposed in the first opening 122 and contacts the first bonding pad 22 and the first passivation layer 23. The third portion 163 connects the first portion 161 and the second portion 162. The third portion 163 is disposed on and contacts a top surface of the first dielectric layer 12 and a sidewall 1221 of the first opening 122. The first portion 161 may be defined as a trace portion. The second portion 162 and the third portion 163 may be defined as a pad portion. The first portion 141 of the first redistribution layer 14 and the first portion 161 of the second redistribution layer 16 are disposed on the portion of the first dielectric layer 12 between the first opening 122 and the second opening 124, or between the second opening 124 and third opening 126.

Figure 6:
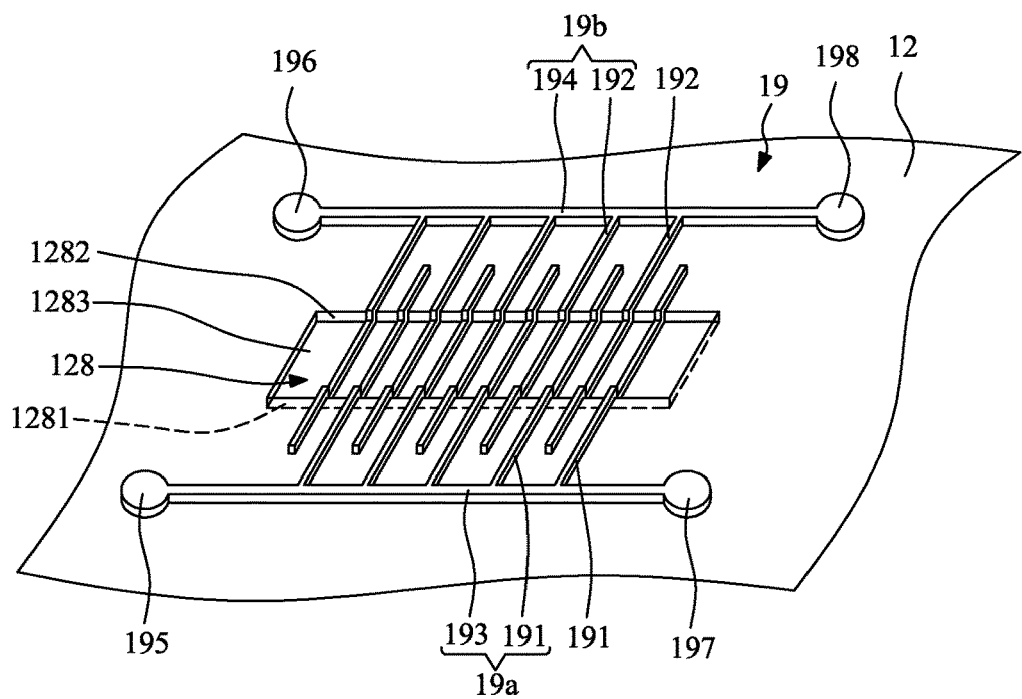
FIG. 6 illustrates a perspective enlarged view of a measurement circuit of the semiconductor device of FIG. 1.

FIG. 6 illustrates a perspective enlarged view of a measurement circuit 19 of the semiconductor device 1 of FIG. 1. The measurement circuit 19 is disposed on the first dielectric layer 12 and in the measurement opening 128. The measurement opening 128 may have a first sidewall 1281, a second sidewall 1282 opposite to the first sidewall 1281, and a bottom surface 1283. In one embodiment, the measurement circuit 19 may include an interdigitated structure that includes a first comb circuit 19a and a second comb circuit 19b facing the first comb circuit 19a. The first comb circuit 19a includes a plurality of first conductive segments 191, a first connecting segment 193, a first testing pad 195 and a third testing pad 197. Each of the first conductive segments 191 is disposed on the first dielectric layer 12 and extends into the measurement opening 128. That is, Each of the first conductive segments 191 is disposed on and contacts the top surface of the first dielectric layer 12, the first sidewall 1281 of the measurement opening 128, the bottom surface 1283 of the measurement opening 128 and the second sidewall 1282 of the measurement opening 128. The first connecting segment 193 is selectively disposed on the top surface of the first dielectric layer 12. All of the first conductive segments 191 are connected to the first connecting segment 193. The first testing pad 195 and the third testing pad 197 are connected to two ends of the first connecting segment 193 respectively. Similarly, the second comb circuit 19b includes a plurality of second conductive segments 192, a second connecting segment 194, a second testing pad 196 and a fourth testing pad 198. Each of the second conductive segments 192 is disposed on the first dielectric layer 12 and extends into the measurement opening 128. That is, Each of the second conductive segments 192 is disposed on and contacts the top surface of the first dielectric layer 12, the first sidewall 1281 of the measurement opening 128, the bottom surface 1283 of the measurement opening 128 and the second sidewall 1282 of the measurement opening 128. The second connecting segment 194 is selectively disposed on the top surface of the first dielectric layer 12. All of the second conductive segments 192 are connected to the second connecting segment 194. The second testing pad 196 and the fourth testing pad 198 are connected to two ends of the second connecting segment 194 respectively.

As shown in FIG. 6, the first conductive segments 191 and the second conductive segments 192 are staggered from each other, and are isolated or insulated from each other. That is, the first conductive segments 191 are not connected to the second comb circuit 19b, and the second conductive segments 192 are not connected to the first comb circuit 19a. Thus, the first comb circuit 19a and the second comb circuit 19b are isolated or insulated from each other. In one embodiment, a line width of the first conductive segments 191 and the second conductive segments 192 of the measurement circuit 19 may be substantially equal to a line width of the first portion 141 of the first redistribution layer 14 or the first portion 161 of the second redistribution layer 16. Further, a gap (e.g., line spacing) between the first conductive segments 191 and the second conductive segments 192 of the measurement circuit 19 may be substantially equal to or less than a gap between the first portion 141 of the first redistribution layer 14 and the first portion 161 of the second redistribution layer 16 on the first dielectric layer 12.

In the embodiment illustrated in FIG. 1 to FIG. 6, the first opening 122, the second opening 124, the third opening 126 and the measurement opening 128 are formed concurrently; and the measurement circuit 19 and the redistribution layers (including, for example, a first redistribution layer 14 and a second redistribution layer 16) are formed concurrently. Thus, the surface conditions of the sidewall 1221 of the first opening 122, the sidewall of the second opening 124 and the sidewall of the third opening 126 may be substantially same as the surface condition of the measurement opening 128. The measurement circuit 19 may simulate the condition of redistribution layers (including, for example, a first redistribution layer 14 and a second redistribution layer 16) after an etching process. During the etching process of a worse case, portions of a sputtered metal layer to be etched may be not removed completely, that is, some portions of the sputtered metal layer to be etched may remain. As a result, the residual metal may cause a short circuit between the redistribution layers (including, for example, a first redistribution layer 14 and a second redistribution layer 16) on the top surface of the first dielectric layer 12 and on the sidewall of the opening (including, for example, the sidewall 1221 of the first opening 122, the sidewall of the second opening 124 and the sidewall of the third opening 126) of the first dielectric layer 12. Thus, a failure of the semiconductor device 1 may be caused. However, such short circuit can be detected by conducting probes of a testing apparatus to measurement circuit 19 as follows. A first probe, a second probe, a third probe and a fourth probe of a testing apparatus are conducted or provided to contact the first testing pad 195, the second testing pad 196, the third testing pad 197 and the fourth testing pad 198, respectively. If the electrical current between the first probe and the second probe is greater than or equal to a predetermined value (e.g., 900 picoamperes (pA)), which means a short circuit is occurred between the first comb circuit 19a and the second comb circuit 19b. That is, a residual metal may remain on the top surface of the first dielectric layer 12 adjacent to the measurement opening 128, the first sidewall 1281 of the measurement opening 128, the bottom surface 1283 of the measurement opening 128 and/or the second sidewall 1282 of the measurement opening 128 at the non-bonding pad region. Meanwhile, a residual metal may be assumed to remain on the top surface of the first dielectric layer 12 adjacent to the opening (including, for example, the first opening 122, the second opening 124 and the third opening 126) at the bonding pad region, and/or on the sidewall of the opening (including, for example, the sidewall 1221 of the first opening 122, the sidewall of the second opening 124 and the sidewall of the third opening 126) at the bonding pad region of the first dielectric layer 12. Thus, a short circuit may be assumed to be occurred between the redistribution layers (including, for example, a first redistribution layer 14 and a second redistribution layer 16), and the quality of the etching process of the redistribution layers (including, for example, a first redistribution layer 14 and a second redistribution layer 16) is judged as unqualified or abnormal. Then, a compensation process is conducted by a further etching process or other suitable process.

If the electrical current between the first probe and the second probe is less than the predetermined value (e.g., 900 picoamperes (pA)), which means an open circuit is occurred between the first comb circuit 19a and the second comb circuit 19b. That is, there is no residual metal remain on the top surface of the first dielectric layer 12 adjacent to the measurement opening 128, the first sidewall 1281 of the measurement opening 128, the bottom surface 1283 of the measurement opening 128 and/or the second sidewall 1282 of the measurement opening 128 at the non-bonding pad region. Meanwhile, it is assumed that there is no residual metal remaining on the top surface of the first dielectric layer 12 adjacent to the opening (including, for example, the first opening 122, the second opening 124 and the third opening 126) at the bonding pad region, and on the sidewall of the opening (including, for example, the sidewall 1221 of the first opening 122, the sidewall of the second opening 124 and the sidewall of the third opening 126) at the bonding pad region of the first dielectric layer 12. Thus, an open circuit may be assumed to be occurred between the redistribution layers (including, for example, a first redistribution layer 14 and a second redistribution layer 16), and the quality of the etching process of the redistribution layers (including, for example, a first redistribution layer 14 and a second redistribution layer 16) is judged as qualified or normal.

Similarly, the electrical current between the first probe and the fourth probe, the electrical current between the second probe and the third probe, the electrical current between the second probe and the fourth probe may be used to assume the quality of the etching process of the redistribution layers (including, for example, a first redistribution layer 14 and a second redistribution layer 16) by the method as stated above. As a result, the quality of the redistribution layers (including, for example, a first redistribution layer 14 and a second redistribution layer 16) after the etching process can be ensured or improved. It is noted that the probes (the first probe, the second probe, the third probe and the fourth probe) of the testing apparatus do not contact the redistribution layers (including, for example, a first redistribution layer 14 and a second redistribution layer 16) directly, thus, the redistribution layers (including, for example, a first redistribution layer 14 and a second redistribution layer 16) may not be damaged.

Figure 7:
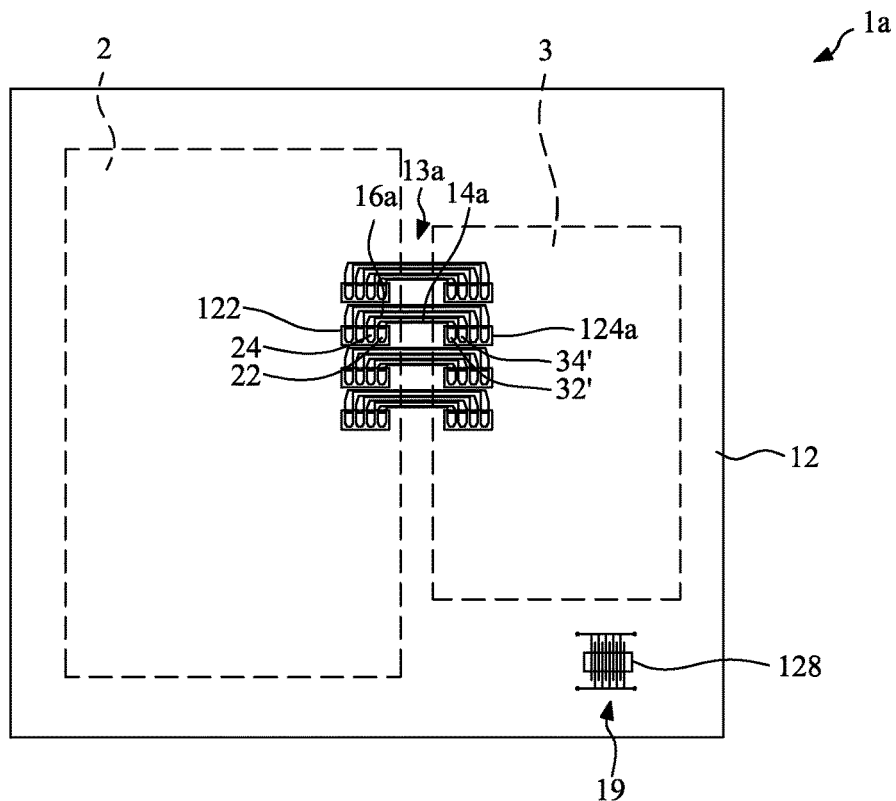
FIG. 7 illustrates a top view of a semiconductor device according to some embodiments of the present disclosure.

FIG. 7 illustrates a top view of a semiconductor device 1a according to some embodiments of the present disclosure. The semiconductor device 1a is similar to the semiconductor device 1 shown in FIG. 1, except for the layout of the patterned circuit layer 13a. The patterned circuit layer 13a is similar to the patterned circuit layer 13 shown in FIG. 1, except for the directions of the redistribution layers (including, for example, a first redistribution layer 14a and a second redistribution layer 16a). The first redistribution layer 14a is disposed on the first dielectric layer 12, and electrically connects the first bonding pad 22 in the first opening 122 and the third bonding pad 32' in the second opening 124a. As shown in FIG. 7, one end of the first redistribution layer 14a extends downward into the first opening 122 to cover and contact the first bonding pad 22, and the other end of the first redistribution layer 14 extends downward into the second opening 124a to cover and contact the third bonding pad 32'. Thus, the extending directions of two ends of the first redistribution layer 14a are the same. The first redistribution layer 14a is substantially in an inverse "U" shape. Similarly, the second redistribution layer 16a is disposed on the first dielectric layer 12, and electrically connects the second bonding pad 24 in the first opening 122 and the fourth bonding pad 34' in the second opening 124a. As shown in FIG. 7, one end of the second redistribution layer 16a extends downward into the first opening 122 to cover and contact the second bonding pad 24, and the other end of the second redistribution layer 16a extends downward into the second opening 124a to cover and contact the fourth bonding pad 34'. Thus, the extending directions of two ends of the second redistribution layer 16a are the same. Thus, a length of the second redistribution layer 16a is greater than a length of the first redistribution layer 14a.

Figure 8:
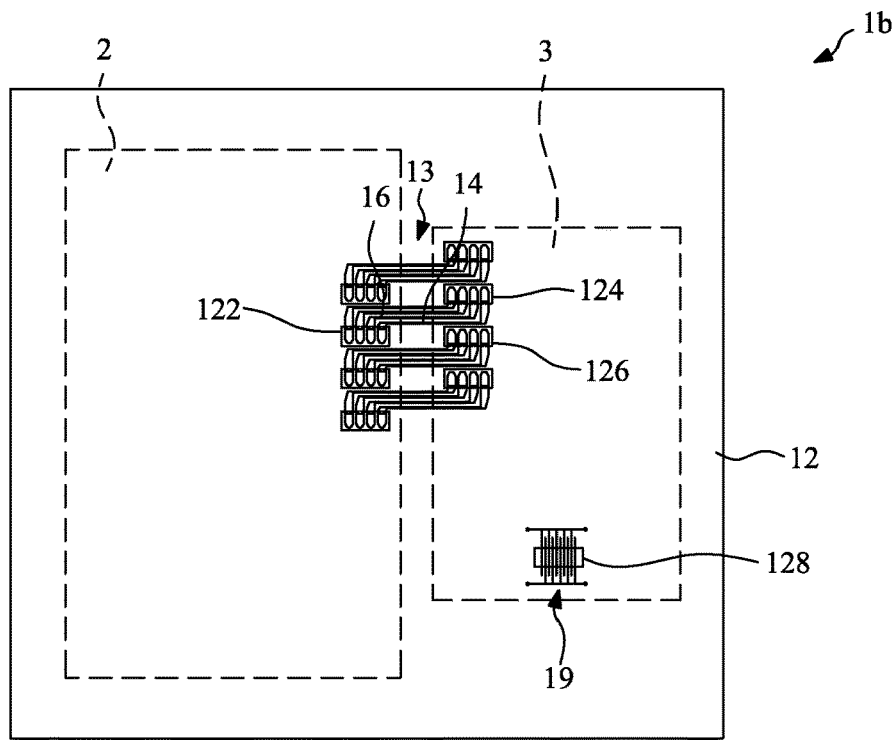
FIG. 8 illustrates a top view of a semiconductor device according to some embodiments of the present disclosure.

FIG. 8 illustrates a top view of a semiconductor device 1b according to some embodiments of the present disclosure. The semiconductor device 1b is similar to the semiconductor device 1 shown in FIG. 1, except for the positions of the measurement opening 128 and the measurement circuit 19. The measurement opening 128 is disposed at a position corresponding to an inside of the second semiconductor die 3. That is, the measurement opening 128 is disposed right above the second semiconductor die 3 from a cross-sectional view. Thus, the measurement opening 128 may expose a portion of the second passivation layer 33 or a portion of the first dielectric layer 12 on the top surface 301 of the second main body 30 of the second semiconductor die 3. The measurement circuit 19 is disposed on the first dielectric layer 12 and in the measurement opening 128. In one embodiment, the measurement opening 128 may be disposed at a position corresponding to an inside of the first semiconductor die 2. That is, the measurement opening 128 may be disposed right above the first semiconductor die 2 from a cross-sectional view. Thus, the measurement opening 128 may expose a portion of the first passivation layer 23 or a portion of the first dielectric layer 12 on the top surface 201 of the first main body 20 of the first semiconductor die 2.

Figure 9:
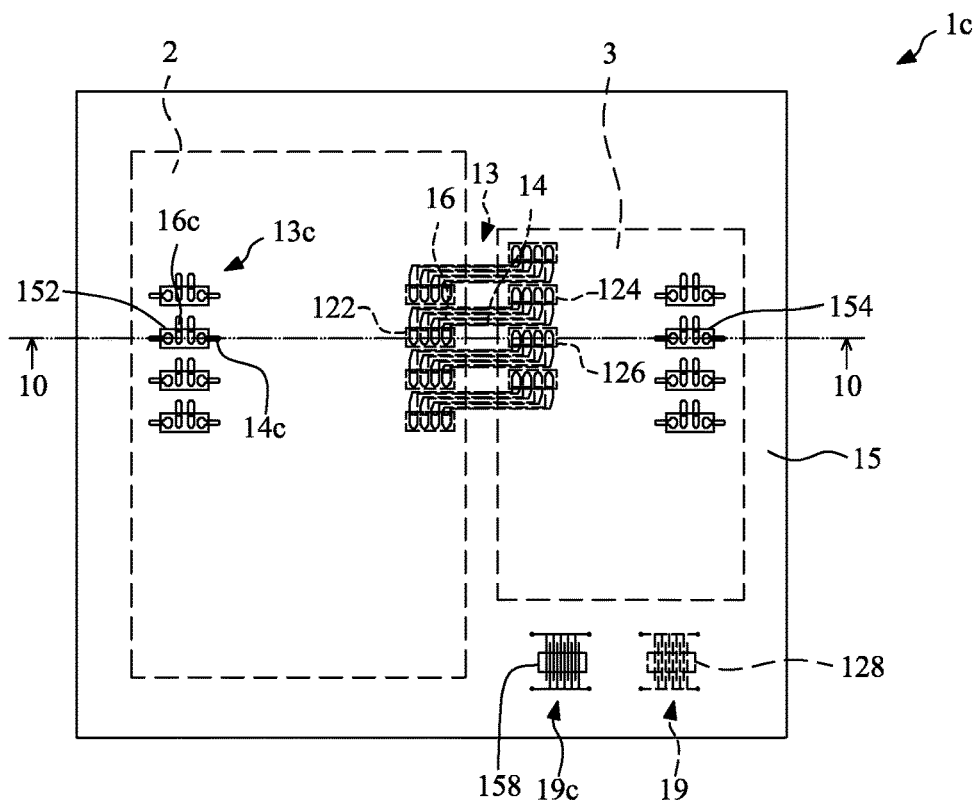
FIG. 9 illustrates a top view of a semiconductor device according to some embodiments of the present disclosure.
Figure 10:
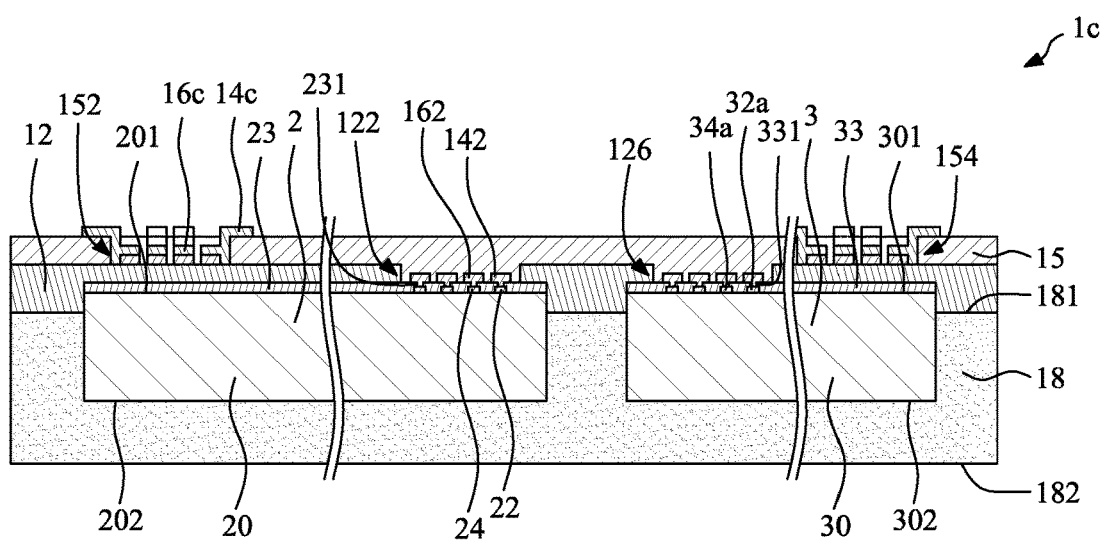
FIG. 10 illustrates a cross-sectional view taken along line 10-10 of the semiconductor device shown in FIG. 9.

FIG. 9 illustrates a top view of a semiconductor device 1c according to some embodiments of the present disclosure. FIG. 10 illustrates a cross-sectional view taken along line 10-10 of the semiconductor device 1c shown in FIG. 9. The semiconductor device 1c is similar to the semiconductor device 1 shown in FIG. 1 to FIG. 5, except that a second dielectric layer 15 and an upper patterned circuit layer 13c are further included. A material of the second dielectric layer 15 may be the same as or different from a material of the first dielectric layer 12. The second dielectric layer 15 is formed or disposed on the first dielectric layer 12 and in the openings (including, for example, the first opening 122, the second opening 124, the third opening 126 and the measurement opening 128) of the first dielectric layer 12. Thus, the second dielectric layer 15 covers and contacts the top surface of the first dielectric layer 12, the patterned circuit layer 13, a portion of the first passivation layer 23 and a portion of the second passivation layer 33. Further, the second dielectric layer 15 defines a plurality of openings (including, for example, the first opening 152, the second opening 154 and the measurement opening 158) to expose a portion of the first dielectric layer 12, and portions of the patterned circuit layer 13.

The upper patterned circuit layer 13c is disposed on the second dielectric layer 15. A material of the upper patterned circuit layer 13c may be copper. The upper patterned circuit layer 13c includes a plurality of redistribution layers (including, for example, a first redistribution layer 14c and a second redistribution layer 16c) and a measurement circuit 19c. In one embodiment, the redistribution layers (including, for example, a first redistribution layer 14c and a second redistribution layer 16c) and the measurement circuit 19c may be at the same layer and formed concurrently. A portion of the first redistribution layer 14c is disposed on the second dielectric layer 15. One end of the first redistribution layer 14c extends into the first opening 152 to cover and contact the portion of the patterned circuit layer 13 in the first opening 152. The first redistribution layer 14c may include a trace portion and a pad portion. Similarly, a portion of the second redistribution layer 16c is disposed on the second dielectric layer 15. One end of the second redistribution layer 16c extends into the first opening 152 to cover and contact the portion of the patterned circuit layer 13 in the first opening 152. The second redistribution layer 16c may include a trace portion and a pad portion. In addition, the measurement circuit 19c is similar to the measurement circuit 19, and is disposed on the second dielectric layer 15 and extends into the measurement opening 158.

Figure 11:
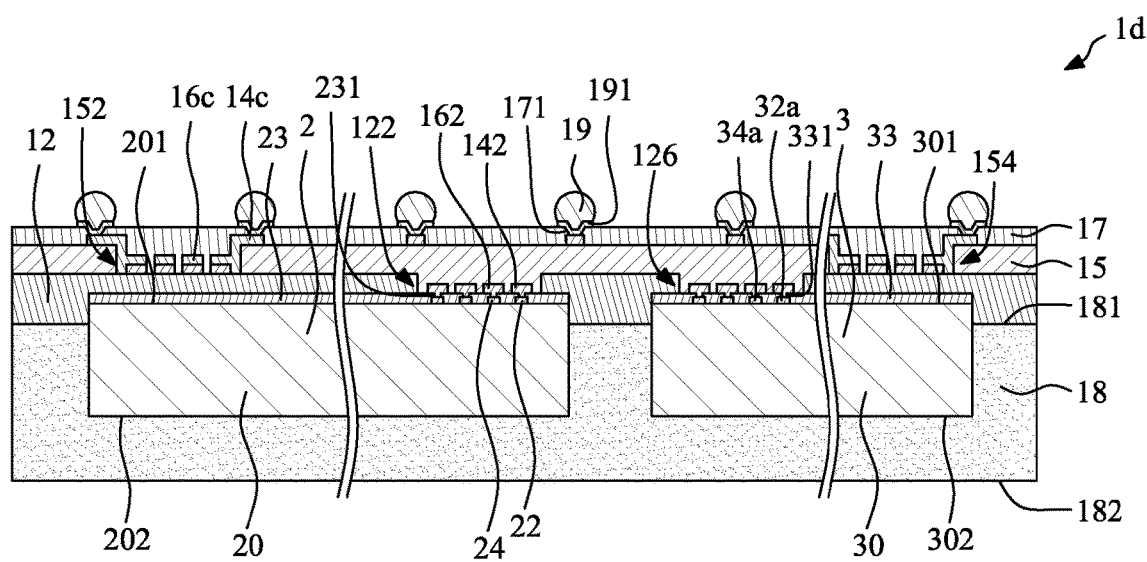
FIG. 11 illustrates a cross-sectional view of a semiconductor device according to some embodiments of the present disclosure.

FIG. 11 illustrates a cross-sectional view of a semiconductor device 1d according to some embodiments of the present disclosure. The semiconductor device 1d is similar to the semiconductor device 1c shown in FIG. 10, except that a protection layer 17, a plurality of under bump metallurgies (UBMs) 191 and a plurality of connecting bumps 19 are further included. A material of the protection layer 17 may be the same as or different from a material of the second dielectric layer 15. The protection layer 17 is formed or disposed on the second dielectric layer 15 and in the openings (including, for example, the first opening 152, the second opening 154 and the measurement opening 158) of the second dielectric layer 15. Thus, the protection layer 17 covers and contacts the top surface of the second dielectric layer 15 and the upper patterned circuit layer 13c. Further, the protection layer 17 defines a plurality of openings 171 to expose portions of the upper patterned circuit layer 13c. The UBMs 191 are disposed on the protection layer 17 and in a respective one of the openings 171 of the protection layer 17 as so to contact the exposed portions of the upper patterned circuit layer 13c. The connecting bumps 19 (e.g., solder balls or solder bumps) are disposed on the respective one of the UBMs 191.

Figure 12:
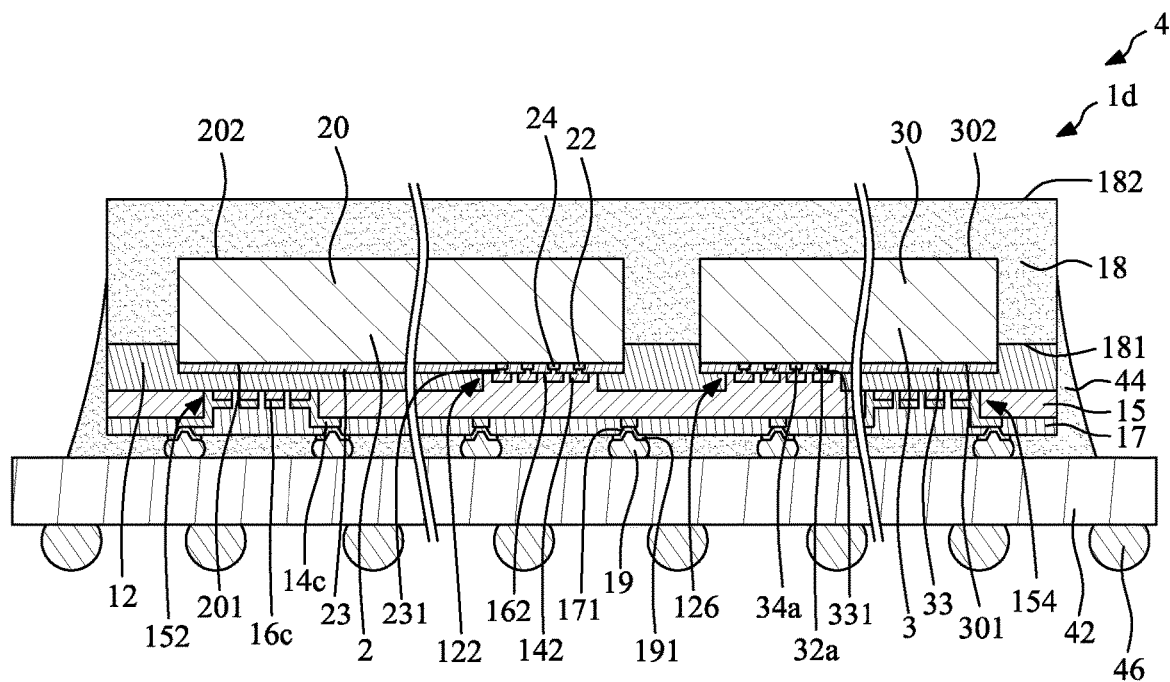
FIG. 12 illustrates a cross-sectional view of a semiconductor package structure according to some embodiments of the present disclosure.

FIG. 12 illustrates a cross-sectional view of a semiconductor package structure 4 according to some embodiments of the present disclosure. The semiconductor package structure 4 includes a semiconductor device 1d, a substrate 42, an underfill 44 and a plurality of external connectors 46. The semiconductor device 1d may be the same as the semiconductor device 1d shown in FIG. 11, and may include a plurality of connecting bumps 19. The semiconductor device 1d is boned to and electrically connected to a top surface of the substrate 42 through the connecting bumps 19. The underfill 44 is disposed between the semiconductor device 1d and the top surface of the substrate 42 to cover and protect the connecting bumps 19. The external connectors 46 (e.g., solder balls or solder bumps) are disposed on the bottom surface of the substrate 42 for external connection. In one embodiment, semiconductor package structure 4 may be electrically connected and bonded to a mother board, such as a PCB board, through the external connectors 46.

FIG. 13 through FIG. 22 illustrate a method for manufacturing a semiconductor device according to some embodiments of the present disclosure. In some embodiments, the method is for manufacturing the semiconductor device 1 shown in FIG. 1 to FIG. 6, and the semiconductor device 1d shown in FIG. 11.

Figure 13:
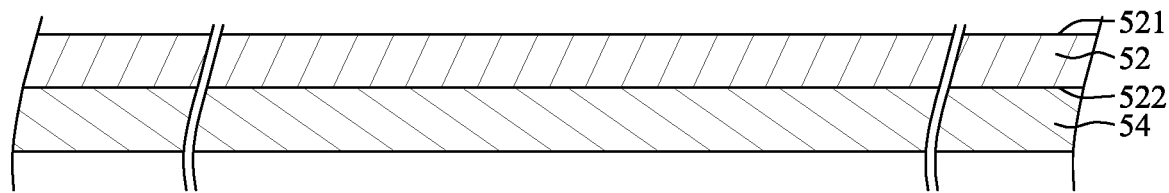
FIG. 13 illustrates one or more stages of an example of a method for manufacturing a semiconductor device according to some embodiments of the present disclosure.

Referring to FIG. 13, a carrier 52 is provided. The carrier 52 may be in a wafer type of a panel type. The carrier 52 has a first surface 521 and a second surface 522 opposite to the first surface 521. In addition, an adhesion layer 54 is disposed adjacent to the second surface 522 of the carrier 52.

Figure 14:
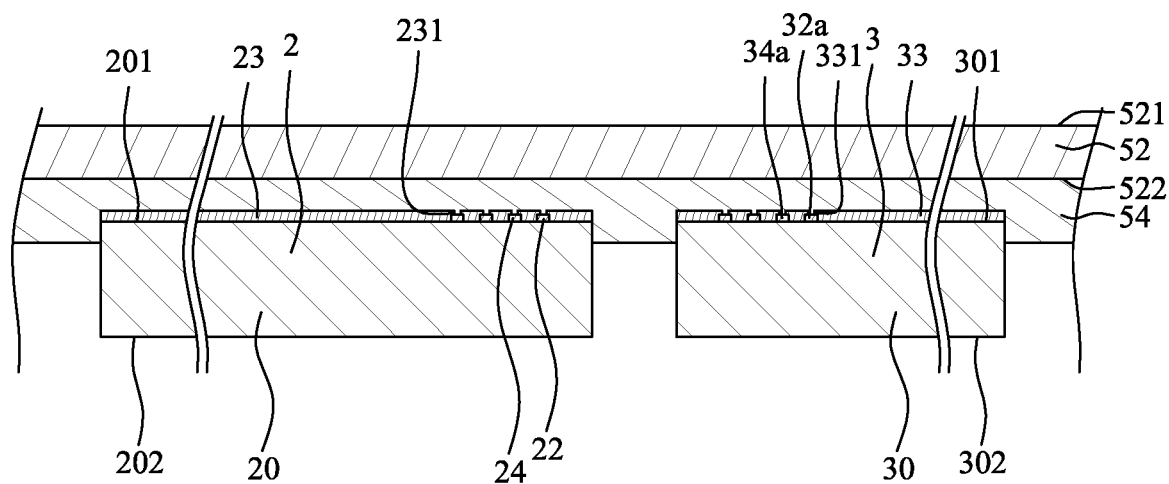
FIG. 14 illustrates one or more stages of an example of a method for manufacturing a semiconductor device according to some embodiments of the present disclosure.

Referring to FIG. 14, a first semiconductor die 2 and a second semiconductor die 3 are disposed adjacent to the adhesion layer 54. The first semiconductor die 2 is disposed adjacent to the second semiconductor die 3 side by side. The first semiconductor die 2 includes a first main body 20, a plurality of bonding pads (including, for example, a first bonding pad 22 and a second bonding pad 24) and a first passivation layer 23. The first main body 20 has a top surface 201 and a bottom surface 202 opposite to the top surface 201. The top surface 201 of the first main body 20 may be an active surface, and the bottom surface 202 of the first main body 20 may be a backside surface. The bonding pads (including, for example, the first bonding pad 22 and the second bonding pad 24) are disposed adjacent to the top surface 201 of the first main body 20. The first passivation layer 23 is formed or disposed adjacent to the top surface 201 of the first main body 20 to cover portions of the bonding pads (including, for example, the first bonding pad 22 and the second bonding pad 24). The first passivation layer 23 defines a plurality of openings 231 to expose respective ones of the bonding pads (including, for example, the first bonding pad 22 and the second bonding pad 24). The second semiconductor die 3 includes a second main body 30, a plurality of bonding pads (including, for example, a third bonding pad 32 and a fourth bonding pad 34) and a second passivation layer 33. The second main body 30 has a top surface 301 and a bottom surface 302 opposite to the top surface 301. The top surface 301 of the second main body 30 may be an active surface, and the bottom surface 302 of the second main body 30 may be a backside surface. The bonding pads (including, for example, the third bonding pad 32 and the fourth bonding pad 34) are disposed adjacent to the top surface 301 of the second main body 30. The second passivation layer 33 is formed or disposed adjacent to the top surface 301 of the second main body 30 to cover portions of the bonding pads (including, for example, the third bonding pad 32 and the fourth bonding pad 34). The second passivation layer 33 defines a plurality of openings 331 to expose respective ones of the bonding pads (including, for example, the third bonding pad 32 and the fourth bonding pad 34).

The top surface of the first semiconductor die 2 and the top surface of the second semiconductor die 3 substantially face the adhesion layer 54. The first semiconductor die 2 and the second semiconductor die 3 sink into the adhesion layer 54. Thus, a portion of the first semiconductor die 2 and a portion of the second semiconductor die 3 may be embedded in the adhesion layer 54. In the illustrated embodiment, the top surface of the first semiconductor die 2 and the top surface of the second semiconductor die 3 may be higher than a bottom surface of the adhesion layer 54.

Figure 15:
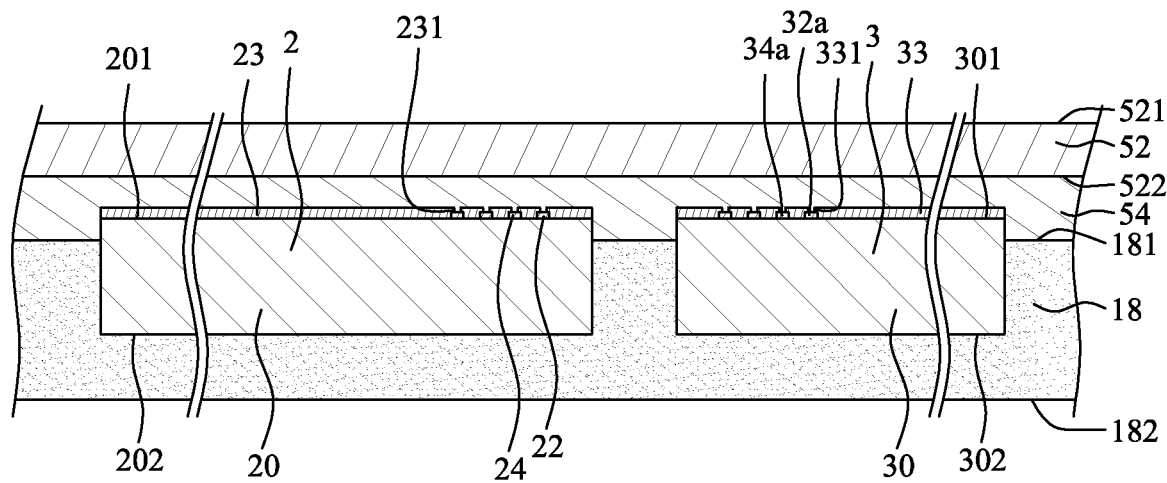
FIG. 15 illustrates one or more stages of an example of a method for manufacturing a semiconductor device according to some embodiments of the present disclosure.

Referring to FIG. 15, an encapsulant 18 is applied to cover the first semiconductor die 2, the second semiconductor die 3 and the bottom surface of the adhesion layer 54. Thus, the encapsulant 18 surrounds at least a portion of the first semiconductor die 2 and at least a portion of the second semiconductor die 3 and fills at least a portion of a space between the first semiconductor die 2 and the second semiconductor die 3.

Figure 16:
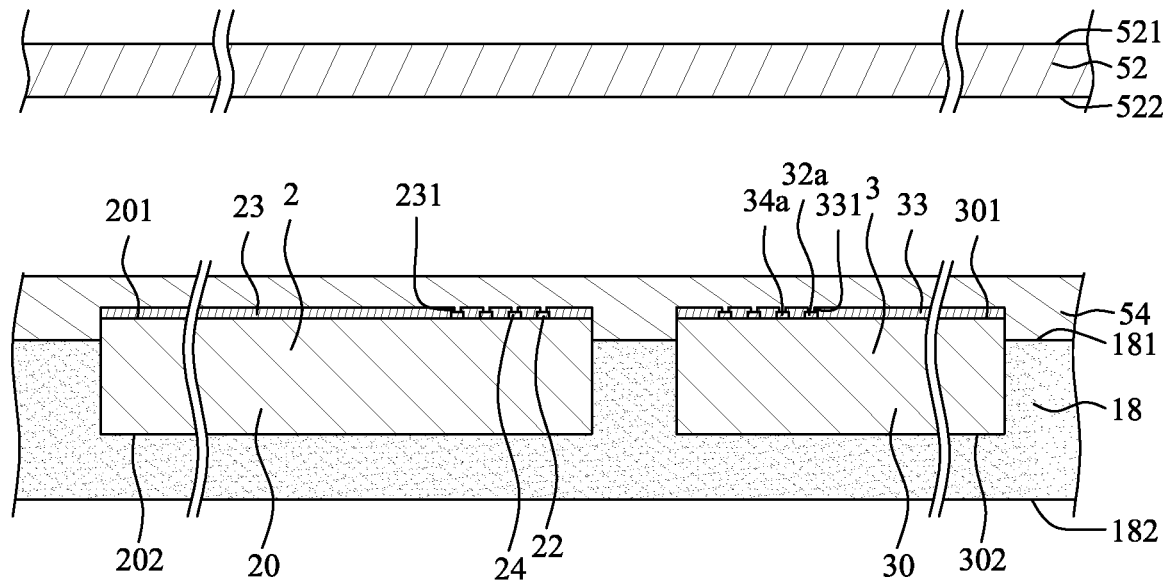
FIG. 16 illustrates one or more stages of an example of a method for manufacturing a semiconductor device according to some embodiments of the present disclosure.

Referring to FIG. 16, the carrier 52 is removed by a heat process or other suitable process.

Figure 17:
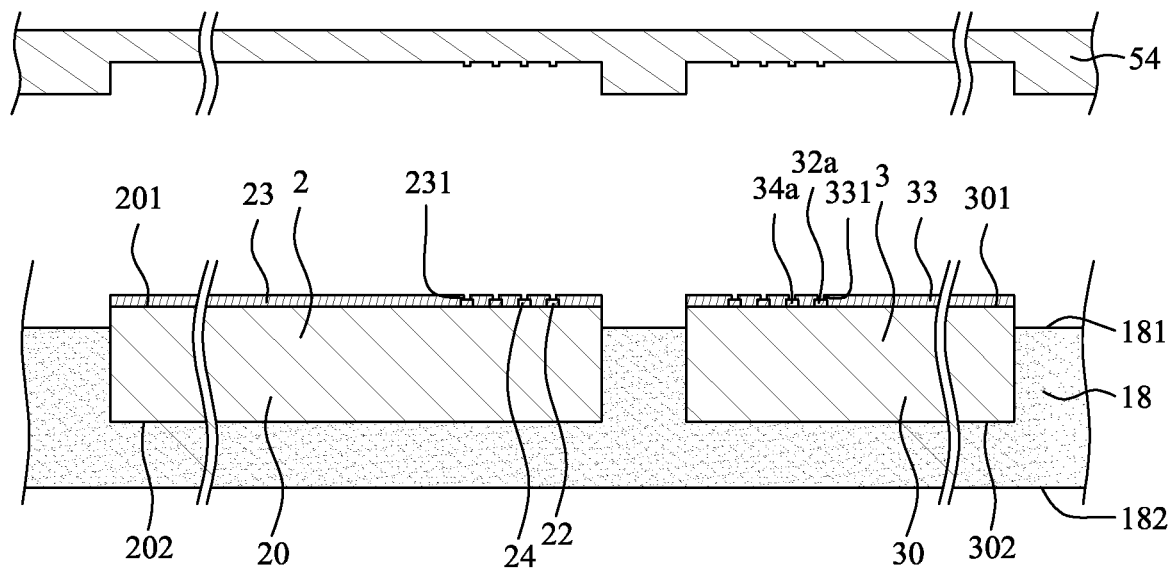
FIG. 17 illustrates one or more stages of an example of a method for manufacturing a semiconductor device according to some embodiments of the present disclosure.

Referring to FIG. 17, the adhesion layer 54 is removed by a heat process or other suitable process.

Figure 18:
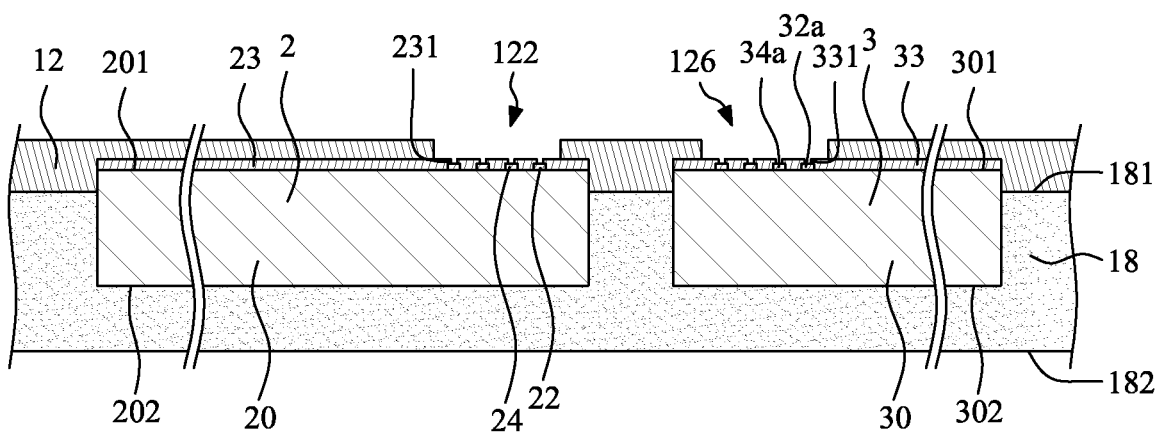
FIG. 18 illustrates one or more stages of an example of a method for manufacturing a semiconductor device according to some embodiments of the present disclosure.
Figure 19:
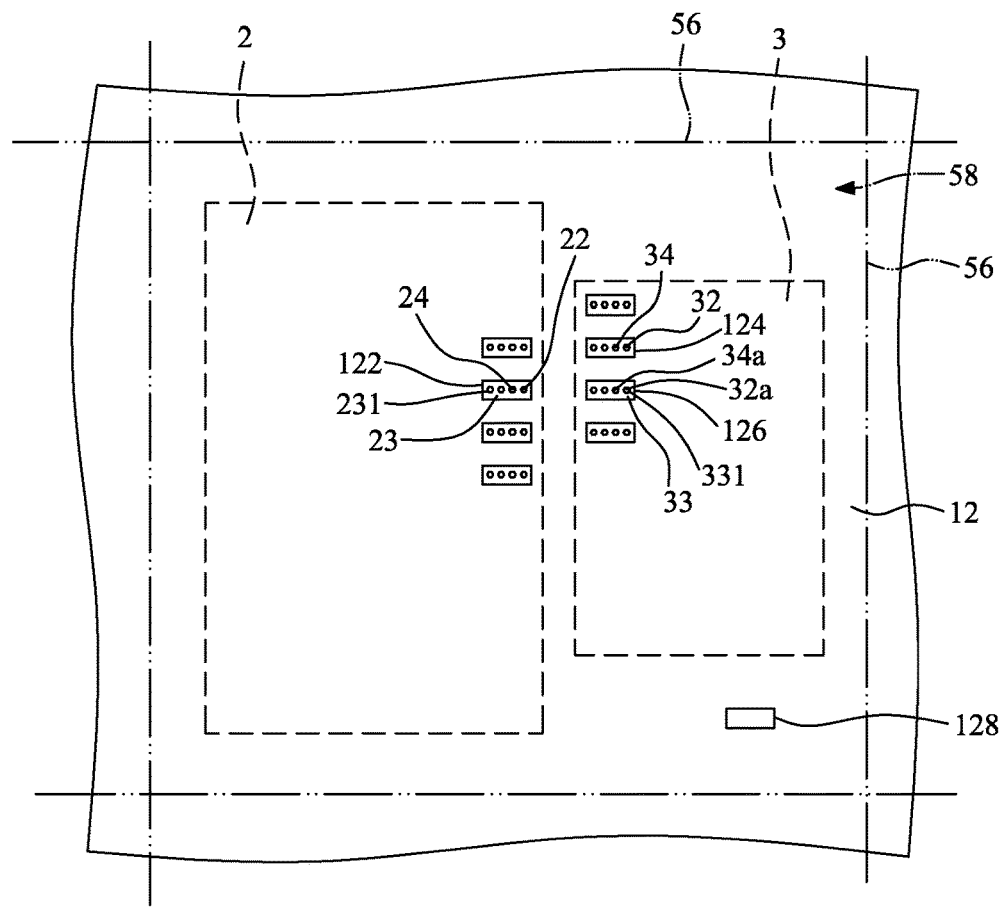
FIG. 19 illustrates a top view of FIG. 18

Referring to FIG. 18 and FIG. 19, wherein FIG. 19 illustrates a top view of FIG. 18, a first dielectric layer 12 is formed or disposed on the first passivation layer 23 of the first semiconductor die 2, the second passivation layer 33 of the second semiconductor die 3 and the encapsulant 18, so as to cover and contact the first passivation layer 23 of the first semiconductor die 2, the second passivation layer 33 of the second semiconductor die 3 and the encapsulant 18. Then, a plurality of openings (including, for example, a first opening 122, a second opening 124, a third opening 126 and a measurement opening 128) are formed in the first dielectric layer 12 by exposure and development process. The first opening 122 exposes a plurality of the bonding pads (including, for example, the first bonding pad 22 and the second bonding pad 24) of the first semiconductor die 2, a plurality of the openings 231 of the first passivation layer 23, and a portion of the first passivation layer 23. The second opening 124 exposes a plurality of the bonding pads (including, for example, the third bonding pad 32 and the fourth bonding pad 34) of the second semiconductor die 3, a plurality of the openings 331 of the second passivation layer 33, and a portion of the second passivation layer 33. The third opening 126 is disposed adjacent to the first opening 122 and the second opening 124. The third opening 126 exposes a plurality of the bonding pads (including, for example, the third bonding pad 32a and the fourth bonding pad 34a) of the second semiconductor die 3, a plurality of the openings 331 of the second passivation layer 33, and a portion of the second passivation layer 33. As shown in FIG. 19, the first opening 122, the second opening 124 and the third opening 126 are disposed in a bonding pad region. In comparison, the measurement opening 128 is disposed in a non-bonding pad region. The first opening 122, the second opening 124, the third opening 126 and the measurement opening 128 may be formed concurrently. In one embodiment, there may be a plurality of cutting lines 56 on the first dielectric layer 12 to define a plurality of units 58. The measurement opening 128 may be disposed within the unit 58, thus, a position of the measurement opening 128 corresponds to the first semiconductor die 2 or the second semiconductor die 3. As a result, the measurement opening 128 may remain in the final product (e.g., the semiconductor device 1 (FIG. 1)) after a singulation process. However, in another embodiment, the measurement opening 128 may be disposed outside the unit 58; thus, a position of the measurement opening 128 is far away from the first semiconductor die 2 or the second semiconductor die 3. As a result, the measurement opening 128 may not remain in the final product (e.g., the semiconductor device 1 (FIG. 1)).

Figure 20:
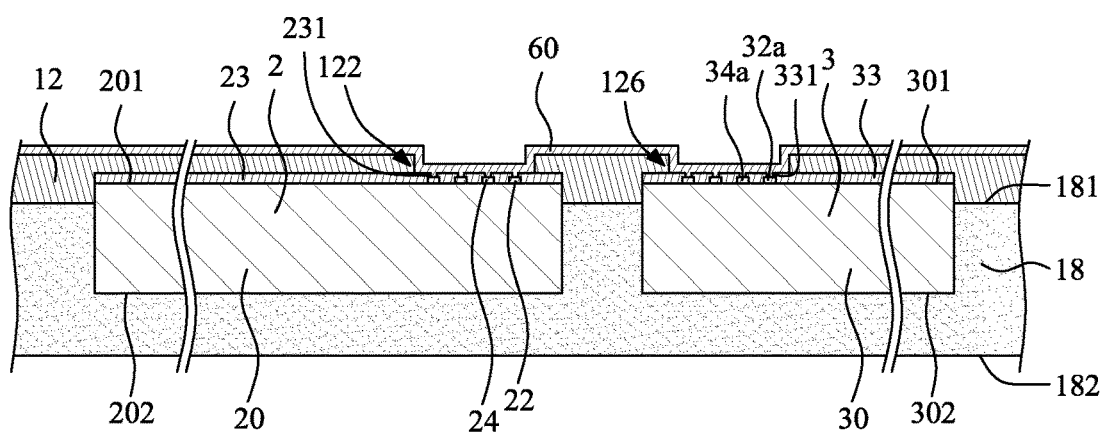
FIG. 20 illustrates one or more stages of an example of a method for manufacturing a semiconductor device according to some embodiments of the present disclosure.

Referring to FIG. 20, a metal layer 60 is formed or disposed on the first dielectric layer 12 and in the openings (including, for example, a first opening 122, a second opening 124, a third opening 126 and a measurement opening 128) of the first dielectric layer 12 by sputtering or other suitable process so as to cover and contact the bonding pads (including, for example, the first bonding pad 22, the second bonding pad 24, the third bonding pad, the fourth bonding pad 34, the third bonding pad 32a and the fourth bonding pad 34a).

Figure 21:
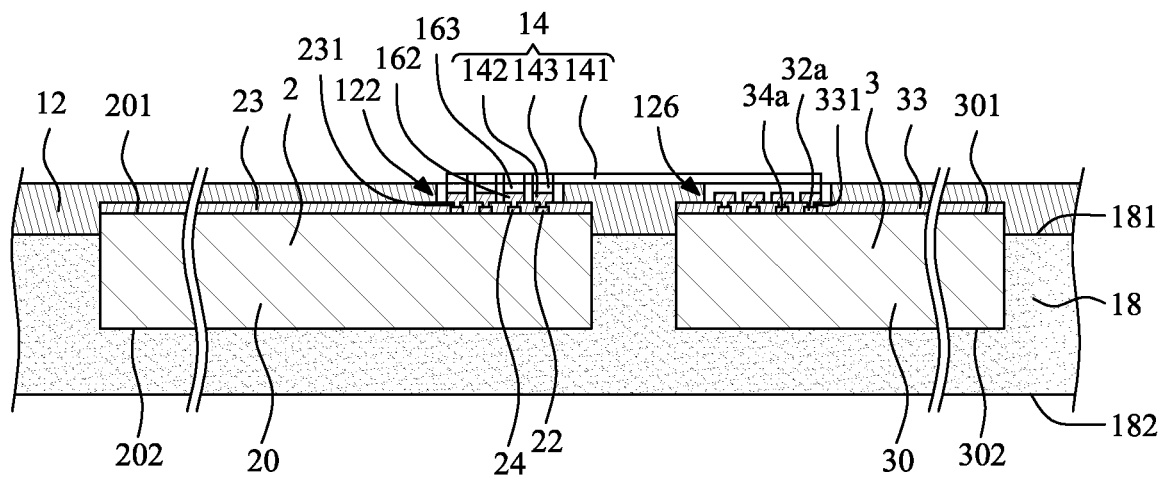
FIG. 21 illustrates one or more stages of an example of a method for manufacturing a semiconductor device according to some embodiments of the present disclosure.
Figure 22:
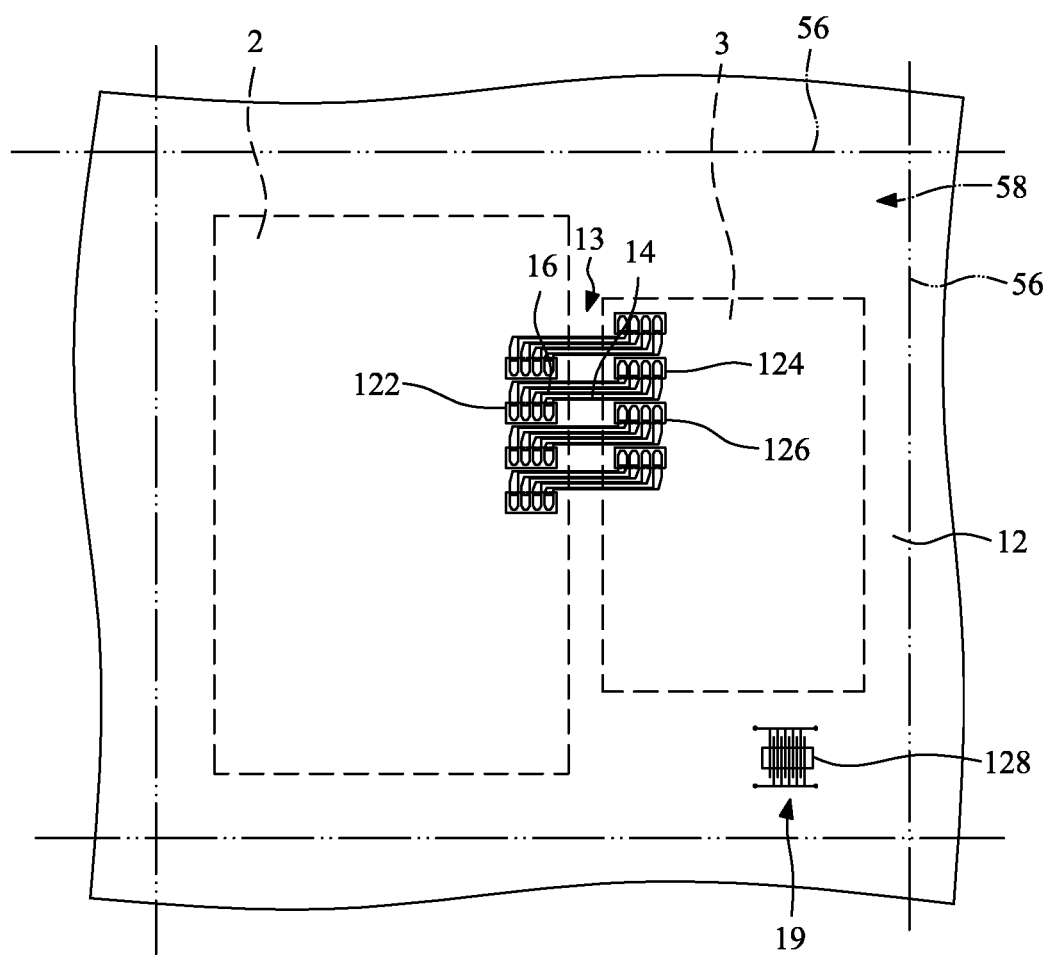
FIG. 22 illustrates a top view of FIG. 21.

Referring to FIG. 21 and FIG. 22, wherein FIG. 22 is a top view of FIG. 21, portions of the metal layer 60 are removed by selective etching or other suitable process so as to form a patterned circuit layer 13 on the first dielectric layer 12. The patterned circuit layer 13 includes a plurality of redistribution layers (including, for example, a first redistribution layer 14 and a second redistribution layer 16) and a measurement circuit 19. In one embodiment, the redistribution layers (including, for example, a first redistribution layer 14 and a second redistribution layer 16) and the measurement circuit 19 may be at the same layer and formed concurrently. The first redistribution layer 14 extends into the first opening 122 to electrically connect the first bonding pad 22, and extends into the second opening 124 to electrically connect the third bonding pad 32. The second redistribution layer 16 extends into the first opening 122 to electrically connect the second bonding pad 24, and extends into the second opening 124 to electrically connect the fourth bonding pad 34. The measurement circuit 19 is disposed on the first dielectric layer 12 and extends into the measurement opening 128. A perspective view of a portion of the first redistribution layer 14 and the second redistribution layer 16 is shown in FIG. 4, and a perspective view of the measurement circuit 19 is shown in FIG. 6.

Then, a current leakage measurement is conducted to the measurement circuit 19 (FIG. 6) as follows. Since the first opening 122, the second opening 124, the third opening 126 and the measurement opening 128 are formed concurrently, the surface conditions of the sidewall 1221 of the first opening 122, the sidewall of the second opening 124 and the sidewall of the third opening 126 may be substantially same as the surface condition of the measurement opening 128. Further, since the measurement circuit 19 and the redistribution layers (including, for example, a first redistribution layer 14 and a second redistribution layer 16) are formed concurrently, the measurement circuit 19 may simulate the condition of redistribution layers (including, for example, a first redistribution layer 14 and a second redistribution layer 16) after the etching process. A first probe, a second probe, a third probe and a fourth probe of a testing apparatus are conducted or provided to contact the first testing pad 195, the second testing pad 196, the third testing pad 197 and the fourth testing pad 198, respectively. If the electrical current between the first probe and the second probe is greater than or equal to a predetermined value (e.g., 900 picoamperes (pA)), which means a short circuit is occurred between the first comb circuit 19a and the second comb circuit 19b. Thus, a short circuit may be assumed to be occurred between the redistribution layers (including, for example, a first redistribution layer 14 and a second redistribution layer 16), and the quality of the etching process of the redistribution layers (including, for example, a first redistribution layer 14 and a second redistribution layer 16) is judged as unqualified or abnormal. Then, a compensation process is conducted by a further etching process or other suitable process.

If the electrical current between the first probe and the second probe is less than the predetermined value (e.g., 900 picoamperes (pA)), which means an open circuit is occurred between the first comb circuit 19a and the second comb circuit 19b. Thus, an open circuit may be assumed to be occurred between the redistribution layers (including, for example, a first redistribution layer 14 and a second redistribution layer 16), and the quality of the etching process of the redistribution layers (including, for example, a first redistribution layer 14 and a second redistribution layer 16) is judged as qualified or normal. Similarly, the electrical current between the first probe and the fourth probe, the electrical current between the second probe and the third probe, the electrical current between the second probe and the fourth probe may be used to assume the quality of the etching process of the redistribution layers (including, for example, a first redistribution layer 14 and a second redistribution layer 16) by the method as stated above. As a result, the quality of the redistribution layers (including, for example, a first redistribution layer 14 and a second redistribution layer 16) of the patterned circuit layer 13 after the etching process can be ensured or improved.

Then, a singulation process is conducted along the cutting lines 56 so as to obtain the semiconductor device 1 of FIG. 1 to FIG. 6.

In one embodiment, before the singulation process, a second dielectric layer 15, an upper patterned circuit layer 13c a protection layer 17, a plurality of under bump metallurgies (UBMs) 191 and a plurality of connecting bumps 19 may be further formed or disposed on the first dielectric layer 12 (as shown in FIG. 11). The second dielectric layer 15 is formed or disposed on the first dielectric layer 12 and in the openings (including, for example, the first opening 122, the second opening 124, the third opening 126 and the measurement opening 128) of the first dielectric layer 12. Then, a plurality of openings (including, for example, the first opening 152, the second opening 154 and the measurement opening 158) are formed in the second dielectric layer 15 to expose a portion of the first dielectric layer 12, and portions of the patterned circuit layer 13. The upper patterned circuit layer 13c is disposed on the second dielectric layer 15. The upper patterned circuit layer 13c includes a plurality of redistribution layers (including, for example, a first redistribution layer 14c and a second redistribution layer 16c) and a measurement circuit 19c. Then, a current leakage measurement is conducted to the measurement circuit 19c to ensure or improve the etching quality of the redistribution layers (including, for example, a first redistribution layer 14c and a second redistribution layer 16c) of the upper patterned circuit layer 13c.

Then, the protection layer 17 is formed or disposed on the second dielectric layer 15 and in the openings (including, for example, the first opening 152, the second opening 154 and the measurement opening 158) of the second dielectric layer 15. Then, a plurality of openings 171 are formed in the protection layer 17 to expose portions of the upper patterned circuit layer 13c. Then, the UBMs 191 are formed or disposed on the protection layer 17 and in a respective one of the openings 171 of the protection layer 17 as so to contact the exposed portions of the upper patterned circuit layer 13c. Then, the connecting bumps 19 (e.g., solder balls or solder bumps) are disposed on the respective one of the UBMs 191. Then, a singulation process is conducted along the cutting lines 56 so as to obtain the semiconductor device 1d of FIG. 11.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a first semiconductor die including a first bonding pad, a second bonding pad and a first passivation layer, wherein the first bonding pad is disposed adjacent to a surface of the first semiconductor die, the second bonding pad is disposed adjacent to the surface of the first semiconductor die, the first passivation layer is disposed adjacent to the surface of the first semiconductor die, and surrounds and exposes the first bonding pad and the second bonding pad;
a second semiconductor die including a third bonding pad and a fourth bonding pad;
a dielectric layer covering the first semiconductor die and the second semiconductor die, and defining a first opening exposing the first bonding pad and the second bonding pad and a second opening exposing the third bonding pad and the fourth bonding pad, wherein the dielectric layer further defines a measurement opening in a non-bonding pad region;
a first redistribution layer disposed on the dielectric layer, and electrically connecting the first bonding pad and the third bonding pad; and
a second redistribution layer disposed on the dielectric layer, and electrically connecting the second bonding pad and the fourth bonding pad.

2. The semiconductor device of claim 1, wherein a portion of the first passivation layer is disposed in the first opening of the dielectric layer.

3. The semiconductor device of claim 2, wherein the first redistribution layer includes a first portion and a second portion, the first portion is disposed on the dielectric layer, and the second portion is disposed in the first opening and contacts the first bonding pad and the first passivation layer.

4. The semiconductor device of claim 3, wherein the first redistribution layer includes a third portion connecting the first portion and the second portion, and the third portion is disposed on a surface of the dielectric layer and a sidewall of the first opening.

5. The semiconductor device of claim 1, further comprising an encapsulant covering at least a portion of the first semiconductor die, at least a portion of the second semiconductor die and at least a portion of the dielectric layer.

6. The semiconductor device of claim 1, wherein the measurement opening exposes a portion of first passivation layer on the surface of the first semiconductor die.

7. The semiconductor device of claim 1, wherein the measurement opening is disposed at a position corresponding to an outside of the first semiconductor die.

8. The semiconductor device of claim 1, wherein a depth of the measurement opening is substantially equal to a depth of the first opening.

9. The semiconductor device of claim 1, further comprising:
a measurement circuit disposed on the dielectric layer and extending into the measurement opening.

10. The semiconductor device of claim 9, wherein the measurement circuit includes an interdigitated structure.

11. The semiconductor device of claim 9, wherein the measurement circuit includes at least two conductive segments, and a gap between the conductive segments of the measurement circuit is substantially equal to or less than a gap between the first redistribution layer and the second redistribution layer on the dielectric layer.

12. The semiconductor device of claim 11, wherein the conductive segments of the measurement circuit are isolated from each other.

13. The semiconductor device of claim 9, wherein a portion of the first redistribution layer contacts a sidewall of the first opening, and a portion of the measurement circuit contacts a sidewall of the measurement opening.

14. The semiconductor device of claim 1, wherein the measurement opening exposes a portion of the dielectric layer.

15. The semiconductor device of claim 9, wherein the first redistribution layer, the second redistribution layer and the measurement circuit are formed concurrently.

16. The semiconductor device of claim 1, wherein extending directions of two ends of the first redistribution layer are different from each other, and extending directions of two ends of the second redistribution layer are different from each other, wherein the second redistribution layer is substantially parallel with the first redistribution layer, and a length of the second redistribution layer is substantially equal to a length of the first redistribution layer.

17. A semiconductor device, comprising:

a first semiconductor die including a first bonding pad and a second bonding pad;

a second semiconductor die including a third bonding pad and a fourth bonding pad;

a dielectric layer covering the first semiconductor die and the second semiconductor die, and defining a first opening exposing the first bonding pad and the second bonding pad and a second opening exposing the third bonding pad and the fourth bonding pad;

a first redistribution layer disposed on the dielectric layer, and electrically connecting the first bonding pad and the third bonding pad;

a second redistribution layer disposed on the dielectric layer, and electrically connecting the second bonding pad and the fourth bonding pad;

a second dielectric layer disposed on the dielectric layer and in the first opening and the second opening of the dielectric layer to cover the first redistribution layer and the second redistribution layer, wherein the second dielectric layer defines an upper measurement opening and a plurality of openings to expose a portion of the first dielectric layer and portions of the first redistribution layer and the second redistribution layer; and an upper patterned circuit layer disposed on the second dielectric layer, wherein the upper patterned circuit layer includes a plurality of redistribution layers and an upper measurement circuit, a portion of the upper patterned circuit layer contacts the exposed portions of the redistribution layer and the second redistribution layer, wherein the upper measurement circuit is disposed on the second dielectric layer and extends into the upper measurement opening.

18. The semiconductor device of claim 17, further comprising:

a protection layer disposed on the second dielectric layer and in the openings of the second dielectric layer, wherein the protection layer defines a plurality of openings to expose portions of the upper patterned circuit layer.

19. A semiconductor device, comprising:

a first semiconductor die including a first bonding pad, a second bonding pad, and a first passivation layer surrounding and exposing the first bonding pad and the second bonding pad;

a second semiconductor die including a third bonding pad and a fourth bonding pad;

a dielectric layer covering the first semiconductor die and the second semiconductor die, and defining a first opening exposing the first bonding pad and the second bonding pad, a second opening exposing the third bonding pad and the fourth bonding pad and a third opening adjacent to the second opening, wherein a portion of the first passivation layer is disposed in the first opening of the dielectric layer;

a first redistribution layer disposed on the dielectric layer, and electrically connecting the first bonding pad and the third bonding pad, wherein the first redistribution layer includes a first portion and a second portion, the first portion of the first redistribution layer is disposed on a portion of the dielectric layer between the second opening and the third opening, and the second portion of the first redistribution layer is disposed in the first opening and contacts the first bonding pad and the first passivation layer; and a second redistribution layer disposed on the dielectric layer, and electrically connecting the second bonding pad and the fourth bonding pad.

* * * * *